Figure 1:
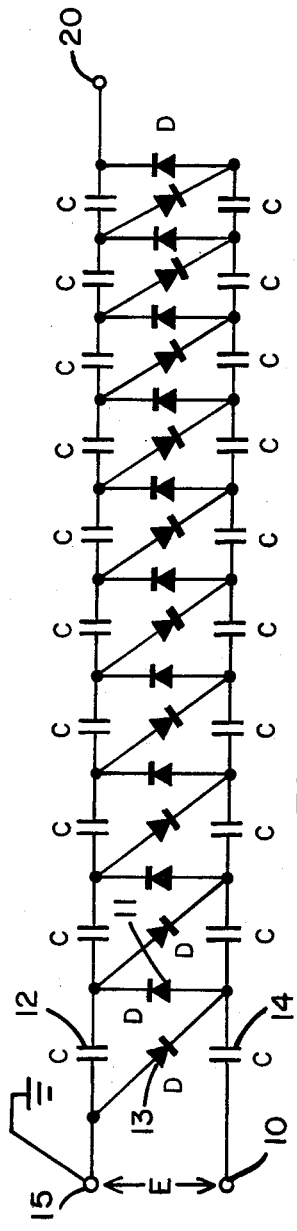

United States Patent [19]

Mommsen et al.

[11] Patent Number: 4,554,622
[45] Date of Patent: Nov. 19, 1985

[54] COMPACT VOLTAGE MULTIPLIER FOR SPRAY GUNS

[75] Inventors: Gordon V. Mommsen, Brooklyn Center; Dale R. Hemming, Fridley, both of Minn.

[73] Assignee: Graco Inc, Minneapolis, Minn.

[21] Appl. No.: 534,740

[22] Filed: Sep. 22, 1983

[51] Int. Cl.[4] ............................................. H02M 7/00
[52] U.S. Cl. .................................... 363/61; 307/110; 361/328
[58] Field of Search ...................... 307/110, 108, 109; 363/59, 60, 61; 361/328, 329

[56] References Cited

U.S. PATENT DOCUMENTS

| | | | |
|---|---|---|---|
| 2,213,199 | 9/1940 | Bouwers et al. | 363/59 |
| 2,856,575 | 10/1958 | Charbonnier | 363/59 |
| 3,593,107 | 7/1971 | Chilton | 363/61 |
| 3,599,038 | 8/1971 | Skidmore | 317/3 |
| 3,872,370 | 3/1975 | Regnault | 317/3 |
| 3,895,262 | 8/1974 | Ribnitz | 317/3 |
| 3,902,108 | 8/1975 | Sion | 363/61 |
| 3,911,292 | 10/1975 | Petrick et al. | 307/110 |
| 4,073,002 | 2/1978 | Sickles et al. | 361/227 |
| 4,075,677 | 2/1978 | Bentley | 361/93 |
| 4,187,527 | 2/1980 | Bentley | 361/235 |
| 4,196,465 | 4/1980 | Buschor | 363/61 |

Primary Examiner—Peter S. Wong
Assistant Examiner—D. L. Rebsch
Attorney, Agent, or Firm—Paul L. Sjoquist

[57] ABSTRACT

A plurality of stages of capacitors and diodes interconnected in a parallel wired Cockcroft-Walton multiplier circuit, wherein capacitors in successive stages of the circuit are constructed of reduced physical size as compared with preceding stages, corresponding to reduced capacitor voltage ratings, to provide a cascade multiplier circuit of reduced total length.

6 Claims, 5 Drawing Figures

U.S. Patent  Nov. 19, 1985  Sheet 1 of 2  4,554,622

COMPACT VOLTAGE MULTIPLIER FOR SPRAY GUNS

BACKGROUND OF THE INVENTION

The present invention relates generally to cascade voltage multiplier circuits of the Cockcroft-Walton type, but more particularly relates to the use of such circuits to develop high voltages in electrostatic spray guns.

The use of semiconductor diodes and capacitors in cascade voltage multiplier circuits to develop high voltage for electrostatic spraying operations is well known in the art. Such circuits have long been used to develop high voltages at a remote location, which high voltage is then conveyed to a spray gun by means of a suitable power cable, and is applied to an electrode associated with the spray gun for developing an electrostatic charging voltage to assist in the application of paints and other liquids. More recently, such circuits have been reduced in size sufficiently to become mounted directly in the spray gun body itself, to multiply the magnitude of a low voltage alterating current supplied to the multiplier to achieve a predetermined electrostatic potential.

Each of the stages of such a voltage multiplier is constructed from a well-known voltage doubler circuit design, and a plurality of such stages are cascaded to create relatively high electrostatic voltages, in the range of 50 to 150 kilovolts (kV). Voltages in this range are suitable for electrostatic charging of sprayed liquids.

One of the problems of utilizing such cascade voltage multiplier circuits in spray guns is caused by the relatively large physical size required to contain circuits capable of producing a reasonable electrostatic voltage. A significant number of cascaded stages are required, and the spray gun body enclosing such circuits must contain sufficient insulating material to eliminate the possibility of dielectric breakdown which would otherwise occur at high electrostatic voltages. Dielectric breakdown problems also require that individual circuit components within a cascade multiplier be physically spaced at reasonable distances in order to avoid interstage arcing within the multiplier.

The number of voltage multiplier stages required in order to develop sufficiently high voltage for effective use in electrostatic spraying presents a further problem in the design of spray guns. For example, it is not unusual to require 10–12 cascaded stages in order to develop the required voltage, and a voltage multiplier having this number of stages occupies a significant length dimension. If such a voltage multiplier is mounted directly in a spray gun body, it results in the spray gun body becoming large, unwieldy, and heavy. All of these factors are undesirable in connection with spray gun design, for it is always a design objective to create a lightweight spray gun which is easy to manipulate and comfortable to handle. Therefore, it is desirable to minimize the physical size of cascade voltage multiplier circuits when such circuits are incorporated directly into spray gun bodies.

SUMMARY OF THE INVENTION

The present invention provides a cascade voltage multiplier circuit of the type suitable for use in electrostatic spray guns, having a significantly smaller length dimension than prior art voltage multipliers, wherein the length of the voltage multiplier is a function of the sum of the length of the individual cascaded stages, and wherein the length of each cascaded stage is principally a function of the physical size of the capacitors in the stage. The invention follows from the recognition that the maximum voltage stresses on successive stages of capacitors in the voltage multiplier is a function of the relative position of such capacitors in the voltage multiplier chain, the farther along the voltage multiplier chain such capacitor stages are found, away from the voltage source, the lesser the voltage stresses on such capacitors. Therefore, the capacitor voltage rating is selected as a function of the position of the capacitor in the voltage multiplier chain. Since the capacitor voltage rating is directly related to the physical size of the capacitor itself, the length dimension of capacitor stages positioned farther along the multiplier chain may be reduced, thereby reducing the overall length of the multiplier.

It is a principal object of the present invention to provide a voltage multiplier circuit for incorporation into a spray gun which is of minimum physical size.

It is a further object of the present invention to provide a voltage multiplier circuit having a minimum length dimension.

BRIEF DESCRIPTION OF THE DRAWINGS

The foregoing and other objects and advantages will become apparent from the following specification and claims, and with reference to the appended drawings in which:

FIG. 1 shows a circuit schematic of a Cockcroft-Walton voltage multiplier;

FIG. 2 shows a prior art multiplier configuration;

FIG. 3 shows a circuit configuration according to the invention;

FIG. 4 shows a view taken along the lines 4—4 of FIG. 3; and

FIG. 5 shows a graph of voltages.

DESCRIPTION OF THE PREFERRED EMBODIMENT

FIG. 1 shows a circuit schematic diagram of a ten-stage Cockcroft-Walton circuit. In a typical embodiment of such a circuit all of the capacitors "C" are of the same capacitive value, and all of the diodes "D" are of the same type. Terminals 10 and 15 constitute the input terminals, and terminal 15 is typically grounded. A predetermined voltage alternating current is applied at terminal 10, and such voltage is stepped up through the successive stages of the voltage multiplier circuit, resulting in a high voltage DC value at output terminal 20. The theory of operation of such circuits is well known in the prior art, and successive stages of voltage multiplication may be added to the circuit if desired. For purposes of example, a "stage" of the voltage multiplier of FIG. 1 comprises capacitors 12 and 14, and diodes 11 and 13. Each such successive "stage" of the voltage multiplier comprises similar pairs of capacitors and diodes. Therefore, it can be seen that the voltage multiplier circuit of FIG. 1 comprises ten stages of voltage multiplication.

Each stage of the multiplier of FIG. 1 theoretically doubles the peak input voltage E, and therefore the theoretical output of the multiplier is twice the peak input voltage E, multiplied by the number of stages. For the circuit of FIG. 1, the theoretical output at terminal 20 is 20E. In actual practice, the theoretical output is reduced by the load drop across the capacitors, the ripple drop, and the voltage drop across the diodes. The voltage drop across the diodes is typically of only nominal value, and may be ignored for purposes of the present invention. Similarly, the voltage drop due to ripple is primarily a function of the capacitance values which are selected for the circuit, and it may be presumed that capacitor values may be selected of sufficiently large value, so as to minimize the ripple voltage drop. The loading drop across the entire multiplier capacitor chain is a sum of the individual capacitor loading drops across the chain. The net effect of the capacitor loading drop is to reduce the overall theoretical output to some lesser value than 2NE, where N represents the number of stages and E represents the input peak voltage.

Figure 5:
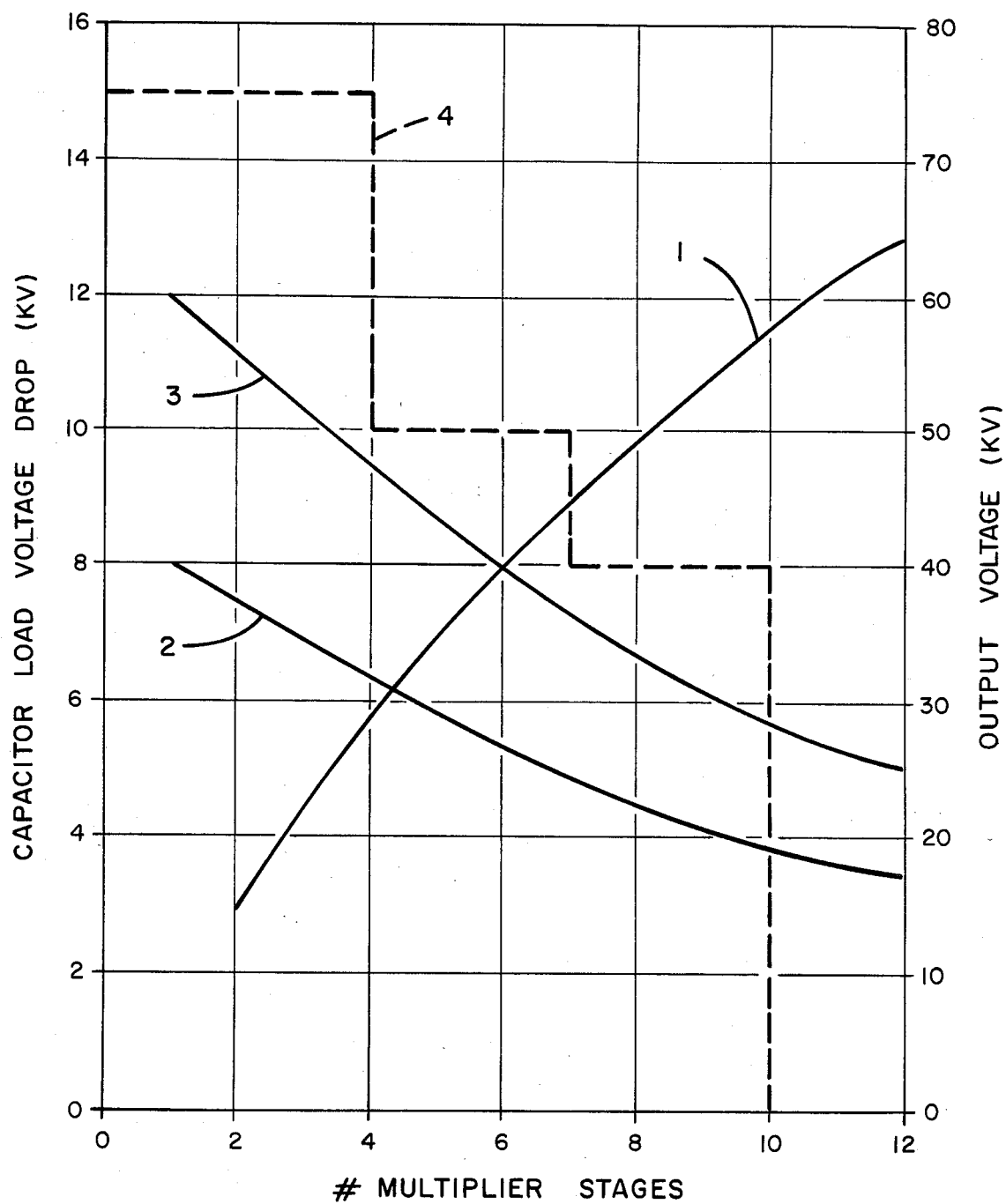

Reference to FIG. 5 shows the actual voltage measurements taken along an N-stage multiplier. The vertical scale on the right side of the graph of FIG. 5 shows the output voltage of a representative voltage multiplier circuit as a function of the number of stages in the circuit, as shown on the lower horizontal scale. The vertical scale on the left side of the graph of FIG. 5 shows the load voltage drop across a single capacitor/diode stage as a function of the position of that stage in the voltage multiplier circuit as shown by the lower horizontal scale. Curve 1 illustrates the cumulative output voltage at each stage of the multiplier, and it is apparent that the voltage increases as the number of stages are increased, but at a decreasing rate. This decreasing rate is attributable to the voltage losses described herein. Curve 2 of FIG. 5 shows the load voltage drop across each capacitor stage of the multiplier, which it is apparent that the voltage drop across the first capacitor stages is significantly greater than the voltage drop across capacitor stages farther along the multiplier chain. Curve 3 of FIG. 5 shows a capacitor voltage curve having a 25% safety factor over the voltage drops of curve 2, which may safely be utilized in the various capacitors at respective stages of the multiplier. Typically, a voltage rating safety factor of approximately 25% is necessary to assure reliable operation of the capacitors without failure for the life of the product. The curves of FIG. 5 show that it is not necessary to maintain a uniform voltage rating of all capacitors in the voltage multiplier chain. For example, curve 3 shows that a safe voltage rating for the capacitors in stage 1 of a multiplier of the type shown should be in the neighborhood of 15 kV, whereas a safe voltage rating for a capacitor in stage 10 of the same multiplier can be approximately 6 kV.

If ceramic capacitors having voltage ratings and capacitance values suitable for use in such circuits are examined, it is found that the physical size of such capacitors varies directly as the capacitor voltage rating. These capacitors may be made rectangular in shape, having for example a predetermined height dimension and a variable length dimension depending upon voltage rating. For example, it has been found that three capacitors having the identical capacitance values, but having voltage ratings of 8 kV, 10 kV and 15 kV respectively, vary in the length dimension by approximately 50%. In other words, a ceramic capacitor having a voltage rating of 8 kV is approximately ½ as long as a ceramic capacitor having a voltage rating of 15 kV, and a ceramic capacitor having a voltage rating of 10 kV is approximately 20% longer than a capacitor having a voltage rating of 8 kV. This information may be put to very good use in the design of a physical layout of a voltage multiplier circuit.

Curve 3 of FIG. 5 shows that the safe voltage rating of capacitors arranged along the multiplier stages may be gradually reduced as the number of stages progress outwardly from the applied voltage source. Theoretically such safe voltage ratings may be reduced according to the following table:

TABLE 1

| Stage Number | Voltage Rating (kV) |
| --- | --- |
| 1 | 12 |
| 2 | 11.2 |
| 3 | 10.5 |
| 4 | 9.5 |
| 5 | 8.6 |
| 6 | 8.0 |
| 7 | 7.2 |
| 8 | 6.6 |
| 9 | 6.2 |
| 10 | 5.7 |

Since the physical length dimension of a capacitor is a direct function of its voltage rating, it is apparent that the physical size of capacitors may be gradually reduced as the number of stages progresses outwardly from the applied voltage source. For example, if the voltage rating of the capacitors shown in Table 1 is compared against the length dimension required for that capacitor and also against the length dimensions of capacitors selected according to the teachings of the prior art, where conventional practice dictates that the voltage rating of all capacitors is selected so as to withstand the voltage stresses of the stage having the greatest voltage drop, an appreciation of the overall savings in length dimension can be had. Assuming a normalized length dimension of 1.0 for the stage 1 capacitor, the comparison is shown in Table 2:

TABLE 2

| Stage Number | Length-Invention | Length-Prior Art |
| --- | --- | --- |
| 1 | 1.0 | 1.0 |
| 2 | .93 | 1.0 |
| 3 | .87 | 1.0 |
| 4 | .79 | 1.0 |
| 5 | .72 | 1.0 |
| 6 | .67 | 1.0 |
| 7 | .60 | 1.0 |
| 8 | .55 | 1.0 |
| 9 | .52 | 1.0 |
| 10 | .48 | 1.0 |
| Total | 7.13 | 10.0 |

Table 2 shows that an overall length dimension savings of about 30% can be achieved in a voltage multiplier having ten stages when the voltage ratings of capacitors are selected according to the teachings of the invention. This means that the length of a spray gun barrel which accommodates the voltage multiplier can be shortened by about 30% when compared with prior art spray guns of similar function.

In a practical application the overall length savings is somewhat less than 30%, because capacitor voltage ratings are not commercially available over a wide range of incremental values. For example, in the preferred embodiment of the invention, ceramic materials for capacitors which are manufactured by Myada Development Company of Hampton, Virginia were selected. Capacitors of this material were cut to sizes to provide voltage ratings of 15 kV, 10 kV and 8 kV respectively, and were chosen for use in the invention in order to provide a significant safety factor in voltage ratings of greater than twice the expected voltage drops. Capacitor voltage ratings from this group were selected for each stage of the multiplier so as to ensure an adequate margin of safety for the voltage stresses likely to be encountered by each stage as represented by curve 2. This resulted in the selection of capacitors having voltage ratings as shown in curve 4 of FIG. 4.

Figure 2:
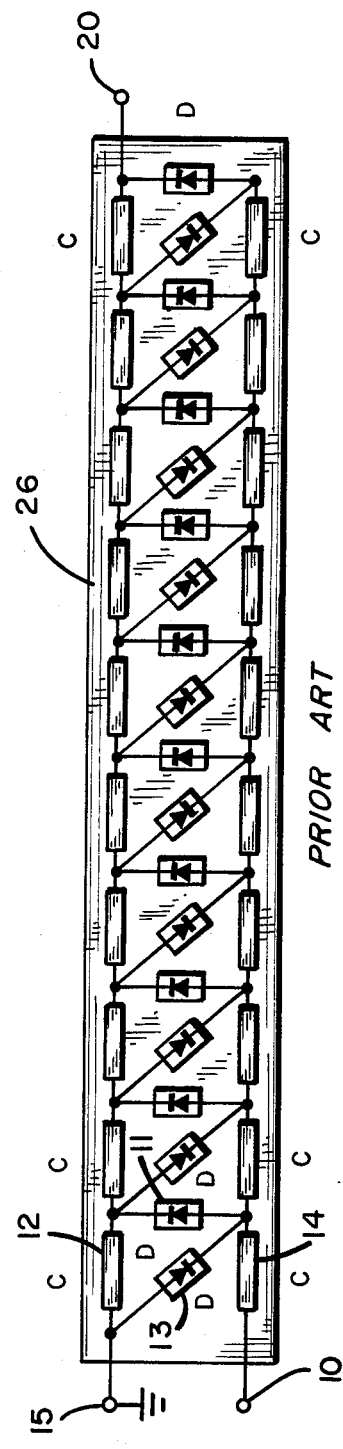

Referring next to FIG. 2 there is shown the physical layout of a ten-stage prior art voltage multiplier circuit. For convenience, the diode symbols are shown in FIG. 2, and it is apparent that the physical layout of a voltage multiplier circuit looks very similar to the electrical schematic of such a circuit. The capacitors are presumed to be identical in value, and identical in voltage rating, and are typically formed of ceramic materials having requisite voltage insulation characteristics.

Figure 3:
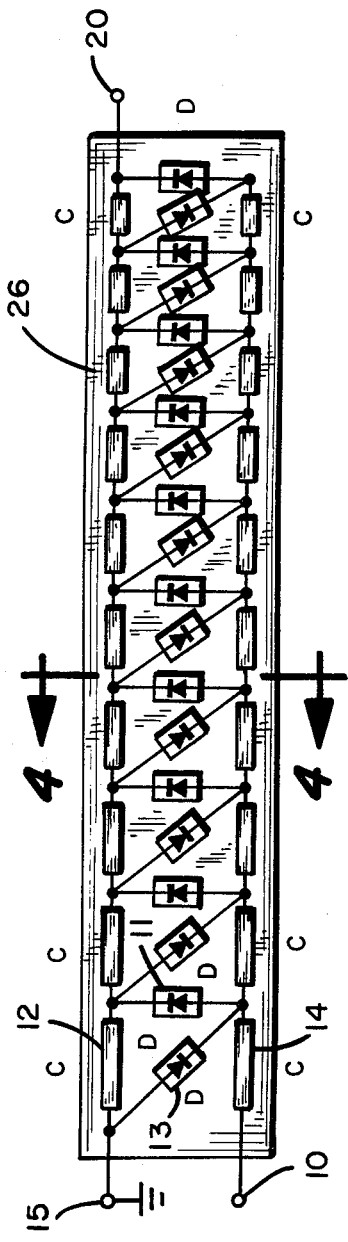

FIG. 3 illustrates a circuit constructed according to the present invention. In the circuit of FIG. 3, the capacitors in the first four stages of the voltage multiplier have been selected to have a voltage rating of 15 kV, the capacitors selected for the next three stages of the voltage multiplier of FIG. 3 have a voltage rating of 10 kV, and the capacitors selected for the last three stages of the voltage multiplier have a voltage rating of 8 kV. By selecting the capacitors in this manner, the overall length of the voltage multiplier of FIG. 3 can be seen to be significantly shorter than the overall length of the voltage multiplier of FIG. 2. This length savings results in a corresponding savings in weight, with the result that the same number of stages of a voltage multiplier may be constructed into a smaller package when the capacitor voltage ratings are taken into account.

Figure 4:
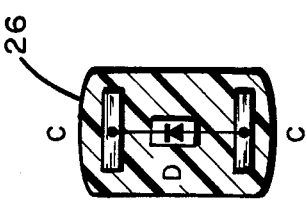

FIG. 4 shows a cross sectional view taken along the lines 4—4 of FIG. 3. The shaded area of FIG. 4 is typically formed of solid epoxy or plastic, and the capacitors and diodes contained within the voltage multiplier are encapsulated into a form as shown in FIG. 4. Most of the weight of a voltage multiplier is contained in the solid encapsulation about the respective capacitors and diodes, and therefore a reduction in the overall length of the multiplier results in a direct reduction in the weight of the multiplier. Thus, it can be seen that by proper selection of the voltage ratings of the respective capacitor stages, to correspond with the actual voltage stresses occurring at these stages, results in an overall reduction in the length of the multiplier as well as the weight of the multiplier.

In operation, it may be impractical to select capacitors having different voltage ratings at each stage, because the economic cost of providing so many different capacitor components makes it feasible to choose only a limited number of voltage ratings. Theoretically, however, capacitor voltage ratings could be selected according to the curve 3 of FIG. 5, and this would clearly result in the construction of a voltage multiplier having the shortest overall length. In practice, the multiplier shown in FIG. 3 represents a compromise over the theoretically optimum multiplier, which compromise is required by the practical limitation of balancing costs in the commercial marketplace. For example, a practical voltage multiplier was constructed utilizing commercially available capacitors, and was designed to accept a volage input of 12 kV, having 10 stages of voltage multiplication. The capacitors available on the open market were sorted according to their size dimensions and voltage ratings, it having been determined that the value of all of the capacitors would be 130 pf. It was discovered that commercially available capacitors suitable for use in the voltage ranges to be expected with this design were available in voltage ratings of 15 kV, 10 kV, and 8 kV, of the following dimensions:

| kV | Width | Length |
|----|-------|--------|
| 15 | .410  | .140   |
| 10 | .410  | .095   |
| 8  | .410  | .075   |

An analysis of the voltage drops across each of the respective stages of the multiplier was reviewed, utilizing data such as that shown in FIG. 5, and it was determined that the 15 kV voltage rating capacitor could be used in the first three stages of the multiplier, whereas the 10 kV voltage rating capacitor could safely be used in the next three stages of the multiplier, and the 8 kV voltage rating capacitor could be used in the remaining four stages of the multiplier. Therefore, a multiplier such as shown in FIG. 3 was constructed and satisfactorily tested, and as a result provided adequate operation with a savings in the overall length of the multiplier of 25%, and a total savings in the weight of the multiplier of 25%, in each case as compared with a multiplier of a conventional design such as shown in FIG. 2.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed is:

1. A solid state voltage multiplier circuit of the Cockcroft-Walton type having capacitors and diodes connected in multiple stages and having the first stage adapted for coupling to a predetermined voltage source and the Nth stage adapted for coupling to a load, and wherein all capacitors have substantially the same capacitance values, and wherein the voltage rating of each of said capacitors is directly proportional to a length dimension of said capacitor, comprising said first stage capacitors having a predetermined first voltage rating and hence a predetermined length dimension, and said Nth stage capacitors having predetermined lower voltage ratings than said first stage, and have predetermined shorter length dimensions, whereby the overall length of said multiplier is reduced.

2. The apparatus of claim 1 wherein said multiplier further comprises more than three stages and said capacitors in said stages further comprise capacitors having at least three predetermined voltage ratings and at least three predetermined length dimensions of successively smaller size.

3. The apparatus of claim 2, wherein said multiplier further comprises ten stages and said capacitors in said stages further comprise capacitors having three predetermined different voltage ratings and three predetermined and successively smaller length dimensions.

4. The apparatus of claim 3, wherein the first four stages of said multiplier have capacitors of a first predetermined voltage rating and a first predetermined length dimension, and the next subsequent three stages of said multiplier have capacitors of a second predetermined voltage rating and a second predetermined length dimension smaller than said first predetermined length dimension, and the next subsequent three stages of said multiplier have capacitors of a third predetermined voltage rating, and a third predetermined length dimension smaller than said second predetermined length dimension, said third predetermined voltage rating being less than said second predetermined voltage rating, and said second predetermined voltage rating being less than said first predetermined voltage rating.

5. A method of constructing a solid state voltage multiplier of the Cockcroft-Walton type having a plurality of stages of capacitors and diodes for minimizing the overall length of the multiplier by the steps of selecting for a first stage of said multiplier capacitors having a first predetermined voltage rating which is greater than the voltage stresses said first stage capacitors receive, said selected first stage capacitors each having a length dimension directly proportional to said first predetermined voltage rating; and selecting for a subsequent stage of said multiplier capacitors having a second predetermined voltage rating which is greater than the voltage stresses said subsequent stage capacitors receive and less than said first predetermined voltage rating, said selected subsequent stage capacitors each having a length dimension directly proportional to said second predetermined voltage rating and smaller than said first stage capacitor length dimensions.

6. The method of claim 5 wherein said plurality of stages comprise more than five and said steps of selecting further comprise at least a third step of selecting for a further stage of said multiplier capacitors having a third predetermined voltage rating which is greater than the voltage stresses said further stage capacitors receive and less than said second predetermined voltage rating, said selected further stage capacitors each having a length dimension directly proportional to said third predetermined voltage rating and smaller than said subsequent stage capacitor length dimensions.

* * * * *